(12) United States Patent
Chang

(10) Patent No.: US 9,030,615 B2
(45) Date of Patent: May 12, 2015

(54) DISPLAY SUBSTRATE, METHOD OF MANUFACTURING THE SAME AND DISPLAY PANEL HAVING THE SAME

(71) Applicant: Samsung Display Co., Ltd., Yongin, Gyeonggi-Do (KR)

(72) Inventor: Jong-Woong Chang, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/455,064

(22) Filed: Aug. 8, 2014

(65) Prior Publication Data

US 2014/0347592 A1 Nov. 27, 2014

Related U.S. Application Data

(63) Continuation of application No. 14/097,663, filed on Dec. 5, 2013, now Pat. No. 8,836,876, which is a continuation of application No. 13/886,515, filed on May 3, 2013, now Pat. No. 8,629,946, which is a continuation of application No. 12/981,817, filed on Dec. 30, 2010, now Pat. No. 8,441,587.

(30) Foreign Application Priority Data

Feb. 2, 2010 (KR) .......... 10-2010-0009414

(51) Int. Cl.
| | | |
|---|---|---|
| G02F 1/133 | (2006.01) | |
| G02F 1/1343 | (2006.01) | |
| G06F 3/038 | (2013.01) | |
| G09G 3/36 | (2006.01) | |
| G02F 1/1362 | (2006.01) | |
| G02F 1/1333 | (2006.01) | |
| H01L 33/08 | (2010.01) | |
| H01L 27/12 | (2006.01) | |

(52) U.S. Cl.
CPC ........ *G02F 1/136209* (2013.01); *G02F 1/1333* (2013.01); *H01L 33/08* (2013.01); *H01L 27/124* (2013.01); *G09G 3/3674* (2013.01); *G02F 1/134336* (2013.01); *G02F 1/136277* (2013.01); *G02F 1/136286* (2013.01)

(58) Field of Classification Search
USPC ......... 349/33, 38, 39, 48, 106, 110, 138, 144, 349/158, 187; 257/59, 72, 43, 350, 408; 345/88, 214; 438/30, 158, 160, 949
See application file for complete search history.

(56) References Cited

U.S. PATENT DOCUMENTS

| | | |
|---|---|---|
| 6,441,878 B1 | 8/2002 | Wong |
| 7,425,998 B2 | 9/2008 | Chang |
| 7,843,520 B2 | 11/2010 | Lu et al. |

(Continued)

FOREIGN PATENT DOCUMENTS

| | | |
|---|---|---|
| JP | 09-101545 A | 4/1997 |
| JP | 2006-126867 A | 5/2006 |

(Continued)

*Primary Examiner* — Akm Enayet Ullah
(74) *Attorney, Agent, or Firm* — Cantor Colburn LLP

(57) ABSTRACT

A display substrate includes a data line disposed on a base substrate, a first pixel electrode disposed at a first side of the data line, a second pixel electrode disposed at a second side of the data line and a storage electrode overlapping with the data line. The storage electrode overlaps with the first pixel electrode by a first overlapping width, and overlaps with the second pixel electrode by a second overlapping width larger than the first overlapping width.

19 Claims, 8 Drawing Sheets

(56) References Cited

U.S. PATENT DOCUMENTS

| | | | |
|---|---|---|---|
| 7,884,366 B2 | 2/2011 | Kwak et al. | |
| 7,990,507 B2 | 8/2011 | Yuh et al. | |
| 8,045,075 B2 | 10/2011 | Chang et al. | |
| 8,259,249 B2 | 9/2012 | Kim et al. | |
| 8,334,940 B2 | 12/2012 | Tseng et al. | |
| 8,378,354 B2 * | 2/2013 | Oh et al. | 257/72 |
| 8,441,587 B2 | 5/2013 | Chang | |
| 8,467,022 B2 * | 6/2013 | Shimomaki | 349/129 |
| 8,629,950 B2 | 1/2014 | Kim et al. | |
| 8,648,973 B2 | 2/2014 | Chang | |
| 2006/0033857 A1 | 2/2006 | Kim et al. | |
| 2007/0268435 A1 * | 11/2007 | Kuo et al. | 349/129 |
| 2009/0146152 A1 | 6/2009 | Kwak et al. | |
| 2009/0268112 A1 | 10/2009 | Lu et al. | |
| 2011/0096051 A1 | 4/2011 | Huangfu | |
| 2011/0128280 A1 | 6/2011 | Tseng et al. | |
| 2011/0187949 A1 | 8/2011 | Chang | |
| 2011/0193835 A1 | 8/2011 | Kim et al. | |
| 2011/0242468 A1 * | 10/2011 | Choi et al. | 349/129 |
| 2011/0304808 A1 | 12/2011 | Jeong et al. | |
| 2011/0317107 A1 | 12/2011 | Chang et al. | |
| 2012/0068241 A1 * | 3/2012 | Sakuma et al. | 257/314 |
| 2012/0105780 A1 | 5/2012 | Jhan et al. | |
| 2012/0307172 A1 * | 12/2012 | Yoshida | 349/43 |
| 2013/0176521 A1 | 7/2013 | Jung et al. | |
| 2013/0182204 A1 | 7/2013 | Shin et al. | |
| 2013/0222750 A1 | 8/2013 | Kim et al. | |
| 2013/0242245 A1 | 9/2013 | Change et al. | |

FOREIGN PATENT DOCUMENTS

| | | |
|---|---|---|
| JP | 2008-134407 A | 6/2008 |
| JP | 2009-145908 A | 7/2009 |
| KR | 1019990080392 A | 11/1999 |
| KR | 1020070080469 A | 8/2007 |
| KR | 1020070104706 A | 10/2007 |
| KR | 1020080035335 A | 4/2008 |
| KR | 1020080040440 A | 5/2008 |
| KR | 1020090072511 A | 7/2009 |

* cited by examiner

DISPLAY SUBSTRATE, METHOD OF MANUFACTURING THE SAME AND DISPLAY PANEL HAVING THE SAME

This application is a continuation application of U.S. application Ser. No. 14/097,663 filed Dec. 5, 2013, which is a continuation application of U.S. application Ser. No. 13/886,515 filed May 3, 2013 and issued as U.S. Pat. No. 8,629,946 on Jan. 14, 2014, which is a continuation application of U.S. application Ser. No. 12/981,817 filed Dec. 30, 2010 and issued as U.S. Pat. No. 8,441,587 on May 14, 2013, which claims priority to Korean Patent Application No. 10-2010-0009414, filed on Feb. 2, 2010, and all the benefits accruing therefrom under 35 U.S.C. §119, the contents of which are herein incorporated by reference in their entirety.

BACKGROUND OF THE INVENTION

1. Field of the Invention

Exemplary embodiments of the invention relate to a display substrate, a method of manufacturing the display substrate and a display panel having the display substrate. More particularly, exemplary embodiments of the invention relate to a display substrate for a liquid crystal display apparatus, a method of manufacturing the display substrate and a display panel having the display substrate.

2. Description of the Related Art

Generally, a liquid crystal display ("LCD") panel includes a first substrate, a second substrate facing the first substrate, and a liquid crystal layer disposed between the first substrate and the second substrate. The LCD receives light from a backlight assembly disposed under the LCD. The LCD panel applies a voltage to the liquid crystal layer and controls a light transmittance to display images.

The first substrate includes a gate line, a data line, a thin-film transistor, a pixel electrode and a storage line. Since the data line is disposed adjacent to the pixel electrode, a coupling capacitance is generated at a boundary between the data line and the pixel electrode due to a potential difference between the data line and the pixel electrode. The coupling capacitance distorts a direction of liquid crystals, so that a light leakage is generated at the boundary between the data line and the pixel electrode. The light leakage is detected as vertical lines, so that display quality is deteriorated. A light blocking layer is formed between the data line and the pixel electrode to prevent the light leakage.

However, an aperture ratio of an area where the pixel electrode is formed is decreased due to the light blocking layer. In addition, when the light blocking layer is connected to the storage line and receives a voltage, a crosstalk causing a distorted signal according to the voltage applied to the pixel electrode adjacent to the light blocking layer may be generated, so that the display quality may be lowered. Further, a capacitance between the light blocking layer and the data line increases as the light blocking layer is formed, so that power consumption may increase.

BRIEF SUMMARY OF THE INVENTION

Exemplary embodiments of the invention provide a display substrate capable of enhancing an aperture ratio and decreasing power consumption.

Exemplary embodiments of the invention provide a method of manufacturing the display substrate.

Exemplary embodiments of the invention provide a display panel capable of decreasing power consumption.

In an exemplary embodiment of display substrate according to the invention, the display substrate includes a base substrate, a data line, a first pixel electrode, a second pixel electrode and a storage electrode. The data line is disposed on the base substrate. The first pixel electrode is disposed at a first side of the data line, and the second pixel electrode is disposed at a second side of the data line. The storage electrode overlaps with the data line, overlaps with the first pixel electrode by a first overlapping width, and overlaps with the second pixel electrode by a second overlapping width larger than the first overlapping width.

In an exemplary embodiment, the display substrate may further include an alignment film disposed on the first and second pixel electrodes, and having a rubbing direction from an area where the first pixel electrode is disposed, to an area where the second pixel electrode is disposed.

In an exemplary embodiment of method of manufacturing a display substrate according to the invention, a storage electrode is formed on a base substrate, and a data line is formed to overlap with the storage electrode. A first pixel electrode is formed to be disposed at a first side of the data line and to overlap with the storage electrode by a first overlapping width on the base substrate including the data line. A second pixel electrode is formed to be disposed at a second side of the data line and to overlap with the storage electrode by a second overlapping width larger than the first overlapping width.

In an exemplary embodiment, an alignment film may be formed on the first and second pixel electrodes. The alignment film may have a rubbing direction from an area where the first pixel electrode is formed, to an area where the second pixel electrode is formed.

In an exemplary embodiment of a display panel according to the invention, the display panel includes a first substrate and a second substrate. The first substrate includes a common electrode. The second substrate faces the first substrate, and includes a data line, a storage electrode, and a first pixel electrode. The storage electrode is disposed under the data line, overlaps with the data line, and receives a second voltage smaller than a first voltage applied to the common electrode. The first pixel electrode is disposed at a first side of the data line and overlaps with the storage electrode.

In an exemplary embodiment, the second voltage may be smaller than a minimum voltage of a third voltage applied to the first pixel electrode.

In an exemplary embodiment, the second substrate may further include a second pixel electrode disposed at a second side of the data line and overlapping with the storage electrode by a second overlapping width. The first and second overlapping widths may be substantially the same with each other.

In an exemplary embodiment, the second substrate may further include an alignment film having a rubbing direction from an area where the first pixel electrode is disposed, to an area where the second pixel electrode is disposed. The alignment film may be disposed on the first and second pixel electrodes. The first overlapping width may be smaller than the second overlapping width.

According to the invention, an aperture ratio of the display panel may be enhanced, and a capacitance between the storage electrode and the data line may be minimized to decrease power consumption.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION OF THE INVENTION

Figure 1:
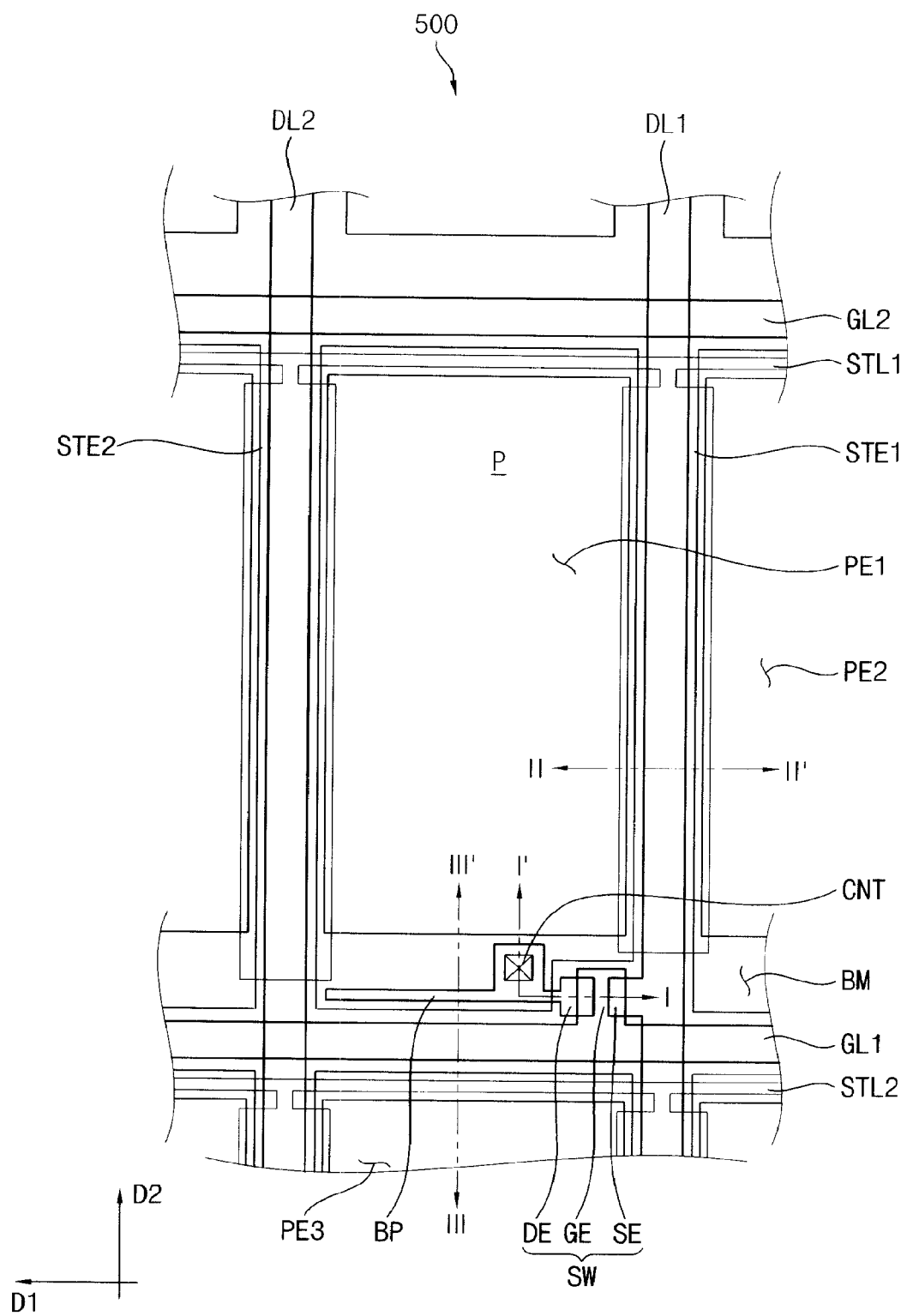
FIG. 1 is a plan view illustrating an exemplary embodiment of a display panel, according to the invention.

The invention is described more fully hereinafter with reference to the accompanying drawings, in which exemplary embodiments of the invention are shown. The invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, connected may refer to elements being physically and/or electrically connected to each other. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "under," "lower," "above," "upper" and the like, may be used herein for ease of description to describe one element or feature's relationship to another element(s) or feature(s) as illustrated in the figures. It will be understood that the spatially relative terms are intended to encompass different orientations of the apparatus in use or operation in addition to the orientation depicted in the figures. For example, if the apparatus in the figures is turned over, elements described as "under" or "lower" relative to other elements or features would then be oriented "above" the other elements or features. Thus, the exemplary term "under" can encompass both an orientation of above and below. The apparatus may be otherwise oriented (rotated 90 degrees or at other orientations) and the spatially relative descriptors used herein interpreted accordingly.

The terminology used herein is for the purpose of describing particular exemplary embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-sectional illustrations that are schematic illustrations of idealized exemplary embodiments (and intermediate structures) of the invention. As such, variations from the shapes of the illustrations as a result, for example, of manufacturing techniques and/or tolerances, are to be expected. Thus, exemplary embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of an apparatus and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be explained in detail with reference to the accompanying drawings.

FIG. 1 is a plan view illustrating an exemplary embodiment of a display panel, according to the invention.

Figure 2:
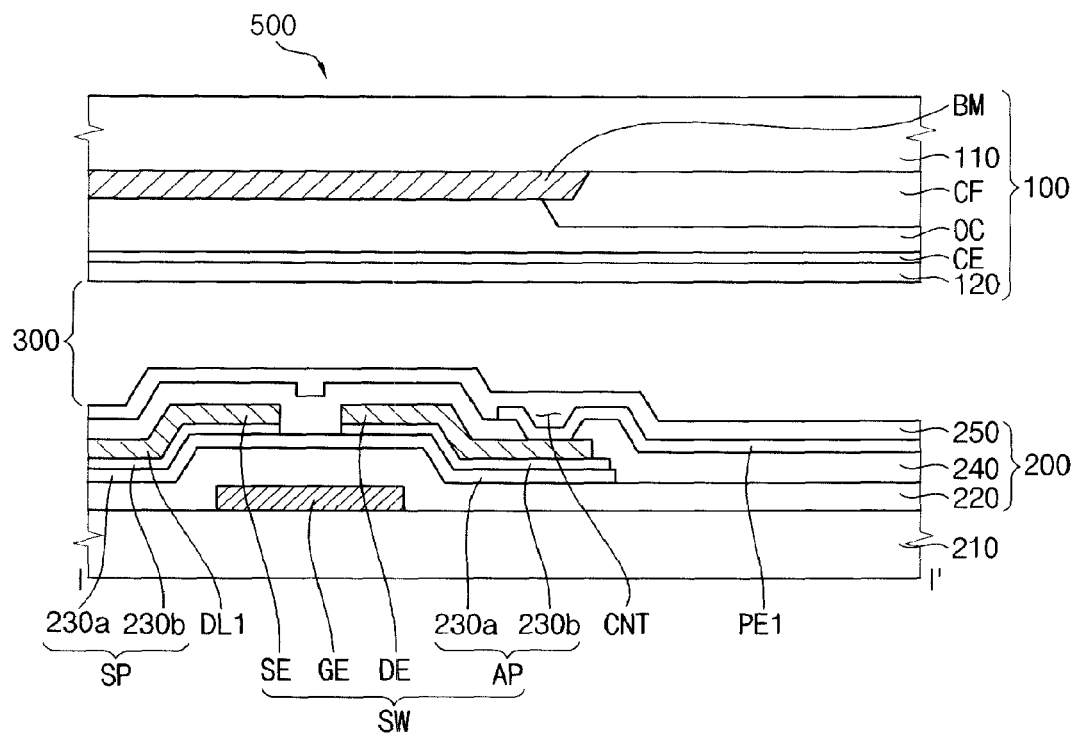
FIG. 2 is a cross-sectional view taken along line I-I' of FIG. 1.

FIG. 2 is a cross-sectional view taken along line I-I' of FIG. 1.

Referring to FIGS. 1 and 2, a first display panel 500 according to the illustrated exemplary embodiment includes a first substrate 100, a second substrate 200 and a liquid crystal layer 300.

The first substrate 100 includes a common electrode CE disposed on a first base substrate 110. The common electrode CE may be disposed over an entire of the first base substrate 110. The common electrode CE receives a first voltage, which is a common voltage Vcom. The first voltage may be from about 3 volts (V) to about 5 volts (V). The first substrate 100 may further include a color filter CF, a black matrix pattern BM, an overcoating layer OC and a first alignment film 120.

The second substrate 200 faces the first substrate 100, and combines with the first substrate 100 to define the liquid crystal layer 300. The second substrate 200 includes first and second gate lines GL1 and GL2, first and second data lines DL1 and DL2, a thin-film transistor SW, first and second storage electrodes STE1 and STE2, first and second storage lines STL1 and STL2, first, second and third pixel electrodes PE1, PE2 and PE3 and a second alignment film 250.

The first and second gate lines GL1 and GL2 longitudinally extend in a first direction D1. The first and second data lines DL1 and DL2 longitudinally extend in a second direction D2, different from the first direction D1. In one exemplary embodiment, the first direction D1 may be substantially perpendicular to the second direction D2.

The thin-film transistor SW is electrically connected to the first gate line GL1 and the first data line DL1. The thin-film transistor SW includes a gate electrode GE connected to the first gate line GL1, a source electrode SE connected to the first data line DL1, a drain electrode DE spaced apart from the source electrode SE and an active pattern AP. The gate electrode GE and the first gate line GL1 collectively form a single unitary and indivisible member, and the source electrode SE and the first data line DL1 collectively form a single unitary indivisible member.

A separation portion between the source electrode SE and the drain electrode DE may have an I-shape, in the plan view of the first display panel 500. Each of the source electrode SE and the drain electrode DE may have a substantially a bar (e.g., rectilinear or rectangular) shape, in the plan view. Therefore, the thin-film transistor SW may be disposed close to an intersection between the first data line DL1 and the first gate line GL1. An area which the thin-film transistor SW occupies on a second base substrate 210, may be minimized. The drain electrode DE may be connected to a light blocking pattern BP extending along a boundary between the first gate line GL1 and the first pixel electrode PE1. The drain electrode DE and the light blocking pattern BP collectively form a single unitary and indivisible member.

The first storage electrode STE1 longitudinally extends in the second direction D2. The first storage electrode STE1 overlaps with the first data line DL1. The first storage electrode STE1 may be disposed under the first data line DL1, that is, between the second base substrate 210 and the first data line DL1.

The second storage electrode STE2 longitudinally extends in the second direction D2, and is disposed in the first direction D1 relative to the first storage electrode STE1. The second storage electrode STE2 overlaps with the second data line DL2. The second storage electrode STE2 may be disposed under the second data line DL2, that is, between the second base substrate 210 and the second data line DL2.

The first storage line STL1 longitudinally extends in the first direction D1. The first storage line STL1 is connected to the first and second storage electrodes STE1 and STE2. The first storage line STL1, the first storage electrode STE1 and the second storage electrode STE2 collectively form a single unitary indivisible member. The first storage line STL1 may be disposed adjacent to the second gate line GL2 along a direction opposite to the second direction D2, in the plan view. In one exemplary embodiment, for example, the first storage line STL1 may be disposed between the first gate line GL1 and the second gate line GL2.

Each of the first and second storage electrodes STE1 and STE2 may receive a second voltage through the first storage line STL1. The second voltage is lower than the first voltage such as the common voltage Vcom received by the common electrode. In addition, the second voltage may be lower than a voltage applied to each of the first and second gate lines GL1 and GL2, and a voltage applied to each of the first and second data lines DL1 and DL2. The second voltage may be a ground voltage or an off voltage. In one exemplary embodiment, for example, when the first voltage is from about 3 V to about 5 V, the second voltage may be higher than or equal to about −7 V, and lower than about 3 V. The second storage line STL2 may be disposed adjacent to the first gate line GL1 along the direction opposite to the second direction D2, in the plan view.

The first pixel electrode PE1 is electrically connected to the thin-film transistor SW. An area where the first pixel electrode PE1 is disposed may be defined as a unit pixel P of the second base substrate 210. The first pixel electrode PE1 is disposed at a first side of the first data line DL1, in the plan view. The first pixel electrode PE1 overlaps with the first storage line STL1. In addition, the first pixel electrode PE1 overlaps with a predetermined area of the first storage electrode STE1. Hereinafter, an edge of the first storage electrode STE1, which is disposed in an area where the first storage electrode STE1 and the first pixel electrode PE1 overlap with each other, is defined as a first side. A side of the first pixel electrode PE1 is referred to as an edge of the first pixel electrode PE1, adjacent to the first data line DL1 and the first side of the first storage electrode STE1. In the plan view, the edge of the first pixel electrode PE1 is disposed between a first (e.g., left) edge of the first data line DL1 and the first side of the first storage electrode STE1.

The second pixel electrode PE2 is disposed at a second side of the first data line DL1, opposite to the first side with respect to the first data line DL1, in the plan view. In the illustrated embodiment, for example, the second pixel electrode PE2 is disposed adjacent to the first pixel electrode PE1 along a direction opposite to the first direction D1. The first data line DL1 is disposed between the second pixel electrode PE2 and the first pixel electrode PE1. The second pixel electrode PE2 may be electrically connected to a third data line (not shown) and the first gate line GL1, and the third data line is disposed adjacent to the second pixel electrode PE2 further along the direction opposite to the first direction D1. The second pixel electrode PE2 partially overlaps with a predetermined area of the first storage electrode STE1. Hereinafter, an edge of the first storage electrode STE1, which is disposed in an area where the first storage electrode STE1 and the second pixel electrode PE2 overlap with each other, is defined as a second side. A side of the second pixel electrode is referred to as an edge of the second pixel electrode PE2, adjacent to the first data line DL1 and the second side of the first storage electrode STE1. In the plan view, the edge of the second pixel electrode PE2 is disposed between a second (e.g., right) edge of the first data line DL1 and the second side of the first storage electrode STE1.

The third pixel electrode PE3 is disposed adjacent to the first pixel electrode PE1 along the direction opposite to the second direction D2, in the plan view. The first gate line GL1 is disposed between the third pixel electrode PE3 and the first pixel electrode PE1. The third pixel electrode PE3 overlaps with the second storage line STL2.

The second alignment film 250 is disposed on the second base substrate 210 including the first, second and third pixel electrodes PE1, PE2 and PE3 disposed on the second base substrate 210. The second alignment film 250 is disposed over and entire of the second base substrate 210. The second alignment film 250 provides pretilt angles to liquid crystal molecules of the liquid crystal layer 300 together with the first alignment film 120 of the first substrate 100.

The second substrate 200 may further include a first insulating layer 220, a semiconductor pattern SP and a second insulating layer 240.

The first insulating layer 220 may be disposed on a first metal pattern disposed on the second base substrate 210. The first metal pattern includes the first and second gate lines GL1 and GL2, the gate electrode GE, the first and second storage electrodes STE1 and STE2 and the first and second storage lines STL1 and STL2, which may be formed via patterning the first metal layer.

The second insulating layer 240 may be disposed on a second metal pattern disposed on the first insulating layer 230. The second metal pattern may include the first and second data lines DL1 and DL2, the source electrode SE and the drain electrode DE, which may be formed via patterning the second metal layer. The second insulating layer 240 includes a contact hole CNT disposed extending through the second insulating layer 240. The drain electrode DE and the first pixel electrode PE1 are electrically connected to each other through the contact hole CNT.

The semiconductor pattern SP is disposed under each of the first and second data lines DL1 and DL2, that is, between the second base substrate 210 and the first date line DL1, and between the second base substrate 210 and the second data line DL2, respectively. The semiconductor pattern SP may include material and layers substantially the same as the active pattern AP. In an exemplary embodiment, the semiconductor pattern SP may be formed at substantially the same time as the active pattern AP, such as in a process of forming the active pattern AP. Each of the semiconductor pattern SP and the active pattern AP includes a semiconductor layer 230a and an ohmic contact layer 230b. A relationship between the semiconductor pattern SP and the first data line DL1 is explained referring to FIGS. 3, 5 and 6.

Figure 3:
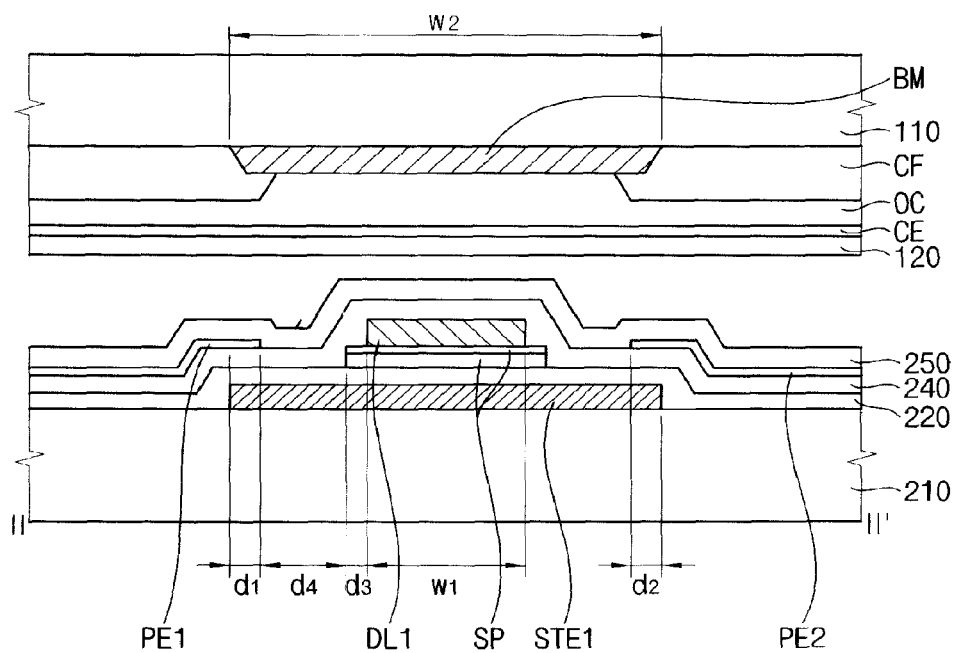
FIG. 3 is a cross-sectional view taken along line II-II' of FIG. 1.

FIG. 3 is a cross-sectional view taken along line II-II' of FIG. 1.

Referring to FIG. 3, the first data line DL1 has a first width $w_1$. When the first width $w_1$ is less than about 0.5 micrometers (μm), reliability of manufacturing the first data line DL1 may be decreased. In an exemplary embodiment, for example, the first data line DL1 may be severed in manufacturing the first data line DL1. When the first width $w_1$ is more than about 3.0 μm, a capacitance between the first data line DL1 and the first storage electrode STE1 increases so that power consumption increases. Therefore, the first width w1 may be from about 0.5 μm to about 3.0 μm. In one exemplary embodiment, for example, the first width w1 may be from about 2.0 μm to about 2.5 μm.

The first storage electrode STE1 is disposed under the first data line DL1, and has a width larger than the first width $w_1$ of the first data line DL1. As illustrated in FIG. 3, both sides (e.g., edges) of the first storage electrode STE1 respectively overlap with the first pixel electrode PE1 and the second pixel electrode PE2. The first storage electrode STE1 overlaps with the first pixel electrode PE1 by a predetermined width in the first direction D1.

The first side of the first storage electrode STE1 is spaced apart from the side of the first pixel electrode PE1 by a first distance d1. The first distance d1 defines a first overlapping width between the first storage electrode STE1 and the first pixel electrode PE1. When the first distance $d_1$ is less than about 1.0 μm, the first storage electrode STE1 may not block a light leakage between the first data line DL1 and the first pixel electrode PE1. When the first distance $d_1$ is more than about 3.0 μm, a coupling capacitance between the first storage electrode STE1 and the first pixel electrode PE1 may be easily generated, and a crosstalk may be generated at a boundary of the first pixel electrode PE1, so that display quality may be deteriorated. Therefore, the first overlapping width between the first storage electrode STE1 and the first pixel electrode PE1 as the first distance d1, may be from about 1.0 μm to about 3.0 μm.

The second side of the first storage electrode STE1 is spaced apart from the side of the second pixel electrode PE2 by a second distance d2. The second distance d2 defines a second overlapping width between the first storage electrode STE1 and the second pixel electrode PE2. When the first storage electrode STE1 is a base line of symmetry, the first pixel electrode PE1 and the second pixel electrode PE2 symmetrically overlap with the first side and the second side of the first storage electrode STE1, respectively. Therefore, the second distance $d_2$ may be substantially the same as the first distance $d_1$. The second overlapping width between the first storage electrode STE1 and the second pixel electrode PE2 as the second distance $d_2$, may be from about 1.0 μm to about 3.0 μm.

The semiconductor pattern SP may have a width larger than the width of the first data line DL1. Edges of the semiconductor pattern SP are protruded further than edges of the first data line DL1, in the plan view. A side (e.g., edge) of the semiconductor pattern SP and a side (e.g., edge) of the first data line DL1, which are adjacent to each other, may be spaced apart from each other by a third distance $d_3$.

When the third distance $d_3$ is more than about 3.0 μm, the semiconductor pattern SP becomes conductive. Thus, a capacitor is defined by the semiconductor pattern SP and the first storage electrode STE1, the semiconductor pattern SP has an area larger than that of the first data line DL1. A capacitance of the capacitor is proportional to an area of the semiconductor pattern SP, so that power consumption increases as a capacitance between the first storage electrode STE1 and the first data line DL1 increases. Therefore, the third distance $d_3$ may be from 0 μm to about 3.0 μm. In one exemplary embodiment, for example, the third distance $d_3$ may be from 0 μm to about 1.75 μm. In addition, the semiconductor pattern SP may not be protruded from the first data line DL1, such that the third distance $d_3$ may approach 0 μm. A relationship between the semiconductor pattern SP and the first storage electrode STE1 is further explained in detail with reference to FIG. 5.

The edge of the first pixel electrode PE1 may be spaced apart from the edge of the semiconductor pattern SP by a fourth distance $d_4$. When the fourth distance $d_4$ is less than about 1.0 μm, a coupling capacitance between the first pixel electrode PE1 and the semiconductor pattern SP may be easily generated, and the crosstalk may be generated at a boundary of the first pixel electrode PE1, so that the display quality may deteriorated. When the fourth distance $d_4$ is more than about 3.0 μm, the first distance $d_1$ between the first storage electrode STE1 and the first pixel electrode PE1 is relatively small, so that a light leakage may not be reduced or effectively prevented. Therefore, the fourth distance $d_4$ may be from about 1.0 μm to about 3.0 μm. A relationship between the edge of the second pixel electrode PE2 and the edge of the semiconductor pattern SP may be substantially the same as the relationship between the edge of the first pixel electrode PE1 and the edge of the semiconductor pattern SP. Therefore, any further repetitive explanations concerning the same or similar elements will be omitted.

A width of the first storage electrode STE1 is larger than the first width w1 of the first data line DL1. When the first data line DL1 is a base line of symmetry, the first storage electrode STE1 is bilaterally symmetric. Therefore, the width the first storage electrode STE1 may be substantially the same as the sum of the first width $w_1$, two times the first distance $d_1$, two times the third distance $d_3$ and two times the fourth distance $d_4$.

The width of the first storage electrode STE1 may be larger than a second width $w_2$ of the black matrix pattern BM, the second width $w_2$ taken in the first direction D1. The black matrix pattern BM is disposed on the first substrate 100 on which the first storage electrode STE1 is disposed. In one exemplary embodiment, for example, the second width $w_2$ may be from about 6.0 μm to about 15.0 μm.

The first storage electrode STE1 receives the second voltage lower than the first voltage applied to the common electrode CE. The second voltage may be a ground voltage or an off voltage. In one exemplary embodiment, for example, when the first voltage is from about 3 V to about 5 V, the second voltage may be more than or equal to about −7 V, and less than about 3 V. A voltage applied to the first storage electrode STE1 is explained hereinafter referring to FIG. 6.

Hereinafter, referring to FIG. 4, a relationship among the first gate line GL1, the storage line STL, the first pixel electrode PE1 and third pixel electrode PE3 is specifically explained.

Figure 4:
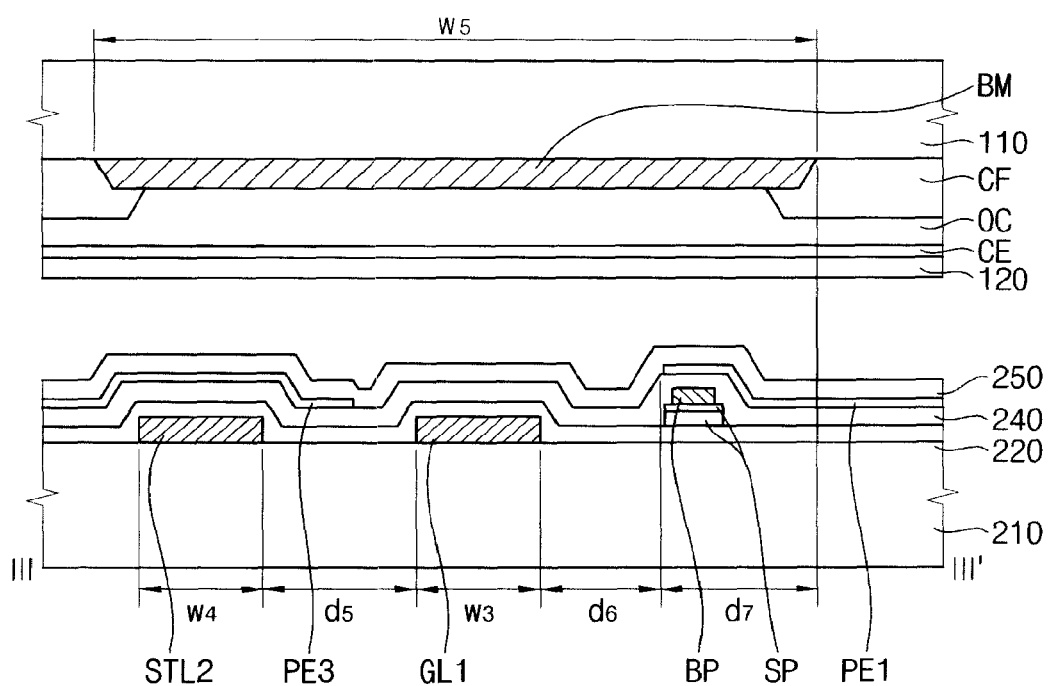
FIG. 4 is a cross-sectional view taken along line of FIG. 1.

FIG. 4 is a cross-sectional view taken along a line III-III' of FIG. 1.

Referring to FIG. 4, the first gate line GL1 has a third width $w_3$. The third width $w_3$ may be from about 1.0 μm to about 3.0 μm. The second storage line STL2 has a fourth width $w_4$. The fourth width $w_4$ may be from about 1.0 μm to about 3.0 μm. The first gate line GL1 is spaced apart from the second storage line STL2 by a fifth distance $d_5$. The fifth distance $d_5$ may be from about 2.5 μm to about 5.5 μm. The first gate line GL1 may be spaced apart from the first pixel electrode PE1 by a sixth distance $d_6$. The sixth distance $d_6$ may be from about 1.0 μm to about 3.0 μm.

The black matrix pattern BM disposed between the first and third pixel electrodes PE1 and PE3 in the plan view, may partially overlap with the first pixel electrode PE1. A seventh distance $d_7$ between an edge of the black matrix pattern BM and an edge of the first pixel electrode PE1 may be from about 1.5 μm to about 4.5 μm. In one exemplary embodiment, for example, a fifth width w5 of the black matrix pattern BM taken in the second direction D2, may be from about 8 μm to about 20 μm. In this case, the black matrix pattern BM is disposed between the first and third pixel electrodes PE1 and PE3.

An aperture ratio of the first display panel 500 may be enhanced by decreasing the widths of the first gate line GL1 and the second storage line STL2. In an exemplary embodiment, a width of the light blocking pattern BP decreases, or the light blocking pattern BP is omitted, so that the aperture ratio of the first display panel 500 may be enhanced.

Figure 5:
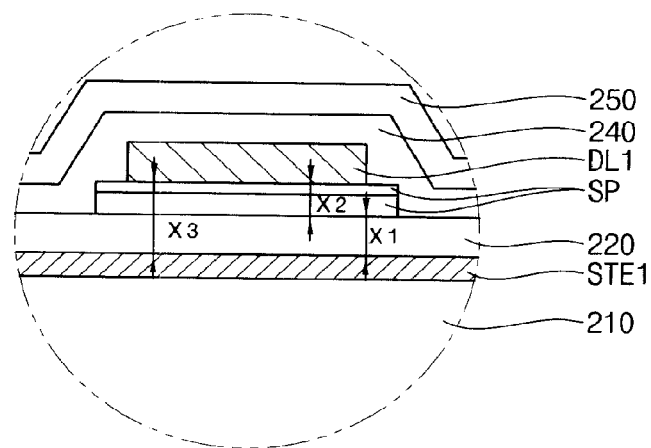
FIG. 5 is an enlarged cross-sectional view illustrating an exemplary embodiment of a first data line in the display panel of FIG. 3.

FIG. 5 is an enlarged cross-sectional view illustrating a first data line of FIG. 3.

Referring to FIG. 5, the first insulating layer 220 having a first thickness $x_1$, is disposed on the first storage electrode STE1. The semiconductor pattern SP having a second thickness $x_2$ is disposed on the first insulating layer 220, and the first data line DL1 is disposed on the semiconductor pattern SP.

When a voltage applied to the first storage electrode STE1 is higher than the first voltage, electrons are charged at a first side of the semiconductor pattern SP by the voltage of the first storage electrode STE1. In this case, the first (e.g., lower) side of the semiconductor pattern SP is adjacent to the first storage electrode STE1, and thus holes are drifted to a second (e.g., upper) side of the semiconductor pattern SP opposite to the first side. Thus, the semiconductor pattern SP has conductivity due to the drift of the electrons. The semiconductor pattern SP substantially becomes conductive, so that a capacitance between the first storage electrode STE1 and the first data line DL1 depends on the first thickness $x_1$ of the first insulating layer 220. In one exemplary embodiment, for example, when the voltage applied to the first storage electrode STE1 is larger than a difference between a voltage applied to the first data line DL1 and a threshold voltage Vth, the capacitance between the first storage electrode STE1 and the first data line DL1 depends on the first thickness $x_1$ of the first insulating layer 220.

When the voltage applied to the first storage electrode STE1 is lower than the first voltage, holes are charged at the first (e.g., lower) side of the semiconductor pattern SP by the voltage of the first storage electrode STE1. In this case, the first side of the semiconductor pattern SP is adjacent to the first storage electrode STE1, and electrons are drifted to a second side of the semiconductor pattern SP opposite to the first side. Therefore, the semiconductor pattern SP has non-conductivity, and thus electrons or holes are not drifted. The capacitance between the first storage electrode STE1 and the first data line DL1 depends on a third thickness $x_3$. In one exemplary embodiment, for example, when the voltage applied to the first storage electrode STE1 is smaller than a difference between the voltage applied to the first data line DL1 and the threshold voltage Vth, the capacitance between the first storage electrode STE1 and the first data line DL1 depends on the third thickness $x_3$ including the first insulating layer 220 and the semiconductor pattern SP.

The third thickness $x_3$ may be substantially the same as the sum of the first and second thickness $x_1$ and $x_2$, or may be smaller than the sum of the first and second thickness $x_1$ and $x_2$. However, the third thickness $x_3$ is larger than the first thickness $x_1$. The capacitance between the first storage electrode STE1 and the first data line DL1 is inversely proportional to the first thickness $x_1$ and the third thickness $x_3$.

The capacitance when the voltage applied to the first storage electrode STE1 is lower than the first voltage, is smaller than the capacitance in case that the voltage applied to the first storage electrode STE1 is higher than the first voltage. Thus, for decreasing the power consumption, a second voltage applied to the first storage electrode STE1 needs to be lower than the first voltage. In one exemplary embodiment, for example, the second voltage may be lower than the voltage applied to the first data line DL1 and voltages applied to each of the first and second pixel electrodes PE1 and PE2.

Hereinafter, referring to FIGS. 2, 3 and 4, an exemplary embodiment of a method of manufacturing the second substrate 200 according to the illustrated exemplary embodiment is briefly explained. Referring to FIGS. 2, 3 and 4, a first metal layer is formed on the second base substrate 210, and then the first metal layer is patterned to form a first metal pattern including the first and second gate lines GL1 and GL2, the first and second storage lines STL1 and STL2, the first and second storage electrodes STE1 and STE2, and the gate electrode GE. The first insulating layer 220 is formed on the second base substrate 210 on which the first metal pattern is formed, and the semiconductor layer 230a, the ohmic contact layer 230b and a second metal layer are sequentially formed on the first insulating layer 220. The semiconductor layer 230a, the ohmic contact layer 230b and the second metal layer are patterned using one mask to form a second metal pattern including the first and second data lines DL1 and DL2, the source electrode SE, the drain electrode DE and the light blocking pattern BP. The second insulating layer 240, the first and second pixel electrodes PE1 and PE2, and the second alignment film 250 are sequentially formed on the second base substrate 210 on which the second metal pattern is formed.

Hereinafter, a method of manufacturing first, second and third example samples is explained, and experimental results of measuring capacitances of the example samples are explained.

In the manufacturing of a first example sample, a first electrode having a width of about 3.0 μm, and a nitride silicon layer having a thickness of about 0.45 μm were formed on a substrate, and then a semiconductor pattern having a thickness of about 0.2 μm and a second electrode were sequentially formed. The semiconductor pattern included an amorphous silicon layer and an amorphous silicon layer doped with N type dopants of a high concentration. The semiconductor pattern was protruded more than the first electrode by about 1.75 μm.

In the manufacturing of a second example sample, the second example sample was substantially the same as the first example sample, except that a width of the second electrode was about 2.0 μm.

In the manufacturing of a third example sample, the third example sample was substantially the same as the second example sample, except that an edge of the semiconductor pattern was substantially the same as an edge of the first electrode.

For the first, second and third example samples, the capacitances between the first and second electrodes were measured with applying a common voltage from about −7.0V and about 3.0 V to the first electrode. The experimental result of the first example sample is illustrated in FIG. 6.

Figure 6:
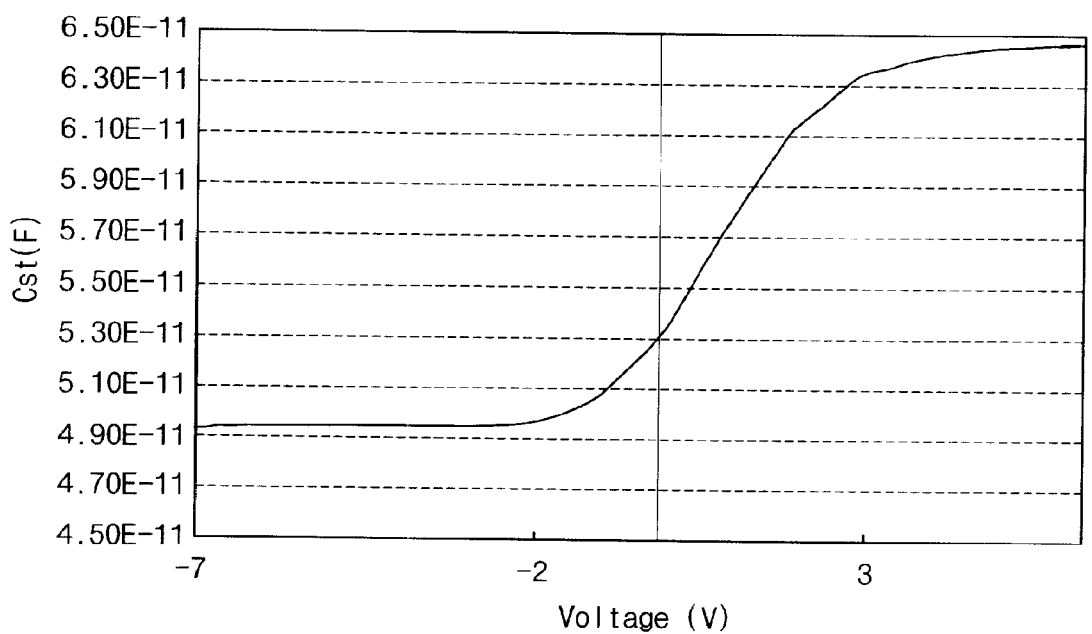
FIG. 6 is a graph illustrating a change of a capacitance between a first electrode and a second electrode according to a voltage applied to the first electrode in a capacitance measuring experiment.

FIG. 6 is a graph illustrating a change of a capacitance between a first electrode and a second electrode according to a voltage applied to the first electrode, in a capacitance measuring experiment.

Referring to FIG. 6, in the first example sample, when the first electrode was applied with a voltage of about 3.0 V, the capacitance (Cst) was about $6.30 \times 10^{11}$ farads (F). The lower a voltage applied to the first electrode is, the smaller the capacitance is. When the first electrode was applied with a voltage of about 0 V, the capacitance was about $5.30 \times 10^{11}$ F. The lower a voltage applied to the first electrode is, the smaller the capacitance is. In addition, when the first electrode was applied with a voltage of about −2.0 V, the capacitance was about $4.90 \times 10^{11}$ F.

Therefore, when the first electrode is applied with a voltage lower than the common voltage, the capacitance between the first and second electrodes, is smaller than the capacitance where the first electrode is applied with a voltage higher than the common voltage.

In the second example sample, when the first electrode was applied with a voltage of about −2.0 V, the capacitance between the first and second electrodes was smaller than the capacitance in case that the first electrode was applied with a voltage of about 3.0 V.

In the third example sample, when the first electrode was applied with a voltage of about −2.0 V, the capacitance between the first and second electrodes was smaller than the capacitance between the first and second electrodes in the second example sample.

As explained above, the first storage electrode STE1 is applied with a second voltage lower than the first voltage, so that the power consumption may decrease. In addition, the first width $w_1$ of the first data line DL1 decreases, and the distance of the protrusion of the semiconductor pattern SP decreases, so that the power consumption may decrease. In addition, the distance between the first storage electrode STE1 and the first and second pixel electrodes PE1 and PE2 decreases, so that the power consumption may decrease and the crosstalk may be minimized. In addition, the width of the first data line DL1 decreases, and the area of the thin-film transistor SW is minimized, so that the aperture ratio of the first display panel 500 may be enhanced.

According to the illustrated exemplary embodiment, the capacitance between the first data line DL1 and the first storage electrode STE1 may decrease, and the aperture ratio of the first display panel 500 may be enhanced.

Figure 7:
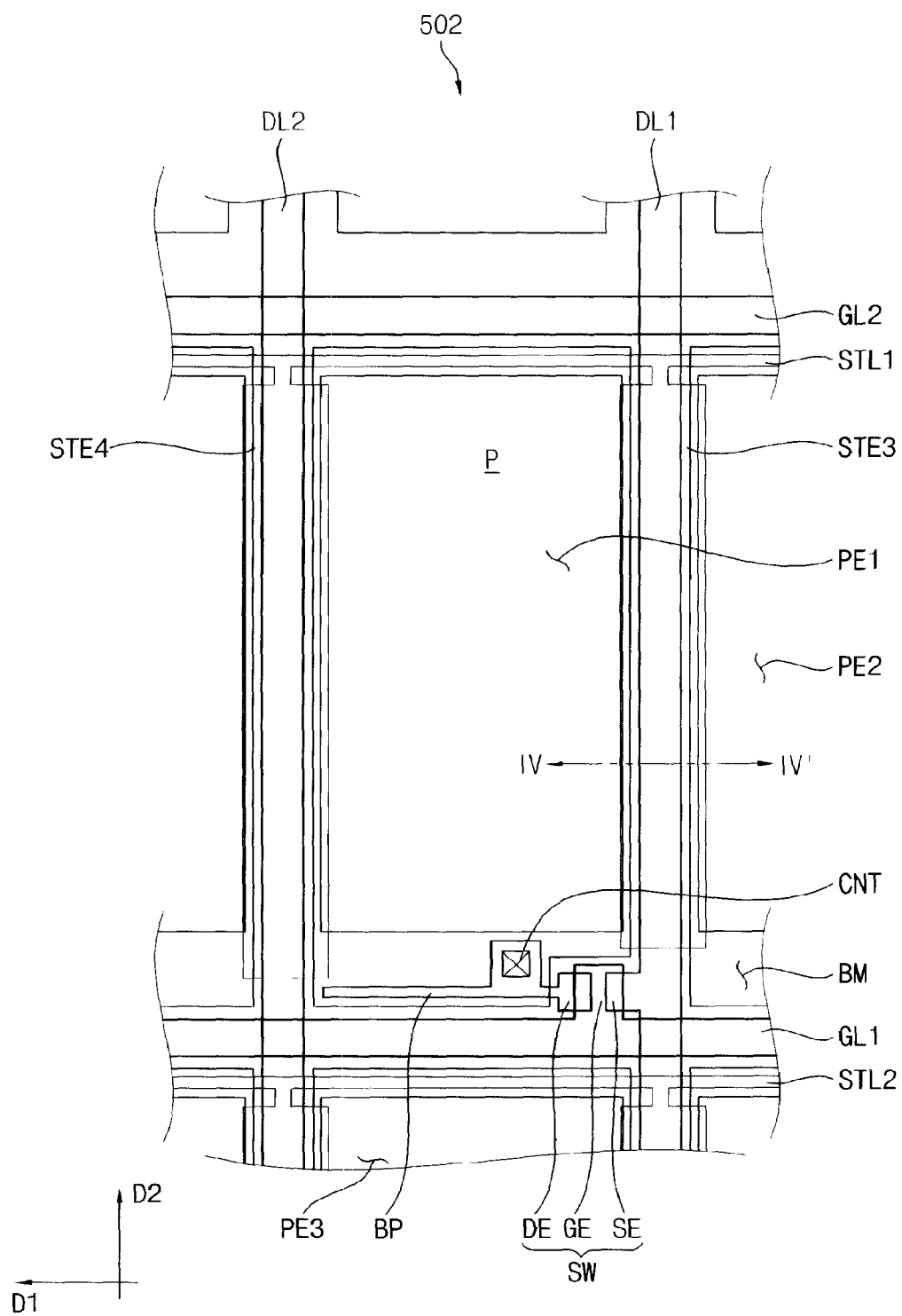
FIG. 7 a plan view illustrating another exemplary embodiment of a display panel, according to the invention.

FIG. 7 a plan view illustrating another exemplary embodiment of a display panel, according to the invention.

Referring to FIG. 7, the second display panel 502 according to the illustrated exemplary embodiment includes a first substrate 100, a second substrate 202 and a liquid crystal layer 300. The first substrate 100 according to the illustrated example embodiment is substantially the same as the first substrate according to the exemplary embodiment illustrated in FIGS. 1 and 2. Therefore, any further repetitive explanations concerning the same or similar elements will be omitted. A common electrode CE of the first substrate 100 is applied with a first voltage.

The second substrate 200 faces the first substrate 100, and combines with the first substrate 100 to define the liquid crystal layer 300. The second substrate 200 includes first and second gate lines GL1 and GL2, first and second data lines DL1 and DL2, a thin-film transistor SW, third and fourth storage electrodes STE3 and STE4, first and second storage lines STL1 and STL2, first, second and third pixel electrodes PE1, PE2 and PE3, and a second alignment film 250. The first storage line STL1, the third storage electrode STE3 and the fourth storage electrode STE4 collectively form a single unitary indivisible member.

The second substrate 202 according to the illustrated exemplary embodiment is substantially the same as the second substrate according to the exemplary embodiment illustrated in FIG. 3, except for the third and fourth storage electrodes STE3 and STE4. Therefore, any further repetitive explanations concerning the same or similar elements will be omitted.

The third storage electrode STE3 longitudinally extends in a second direction D2 in which the first data line DL1 extends. The third storage electrode STE3 overlaps with the first data line DL1. The third storage electrode STE3 may be disposed under the first data line DL1, that is, between the second base substrate 210 and the first data line DL1. Opposing sides (e.g., edges) of the third storage electrode STE3, respectively overlap with the first pixel electrode PE1 and the second pixel electrode PE2, in the plan view.

The fourth storage electrode STE4 longitudinally extends in the second direction D2, and is disposed in a first direction D1 relative to the third storage electrode STE3. The fourth storage electrode STE4 overlaps with the second data line DL2. The fourth storage electrode STE4 may be disposed under the second data line DL2, that is, between the second base substrate 210 and the second data line DL2.

The third and fourth storage electrodes STE3 and STE4 are connected to each other through the first storage line STL1 extending in the first direction D1. Each of the third and fourth storage electrodes STE3 and STE4 may receive a second voltage through the first storage line STL1. The second voltage may be substantially the same as the first voltage, or higher than the first voltage, or lower than the first voltage. In one exemplary embodiment, for example, the second voltage may be lower than the first voltage. In addition, when the first voltage is from about 3 V to 5 V, the second voltage may be higher than or equal to about −7 V, and lower than about 3 V.

Hereinafter, an edge of the third storage electrode STE3, which is disposed in an area where the third storage electrode STE3 and the first pixel electrode PE1 overlap with each other, is defined as a third side. A side of the first pixel electrode PE1 is referred to as a first edge of the first pixel electrode PE1, adjacent to the first data line DL1 and the third side of the third storage electrode STE3.

In addition, an edge of the third storage electrode STE3, which is disposed in an area where the third storage electrode STE3 and the second pixel electrode PE2 overlap with each other, is defined as a fourth side. A side of the second pixel electrode PE2 is referred to as a second edge of the second pixel electrode PE2, adjacent to the first data line DL1 and the fourth side of the third storage electrode STE3.

A distance between the third side of the third storage electrode STE3 and the first edge of the first pixel electrode PE1, is different from a distance between the fourth side of the third storage electrode STE4 and the second edge of the second pixel electrode PE2. Hereinafter, referring to FIG. 7, a relationship between the third storage electrode STE3 and the first and second pixel electrodes PE1 and PE2 is specifically explained.

Figure 8:
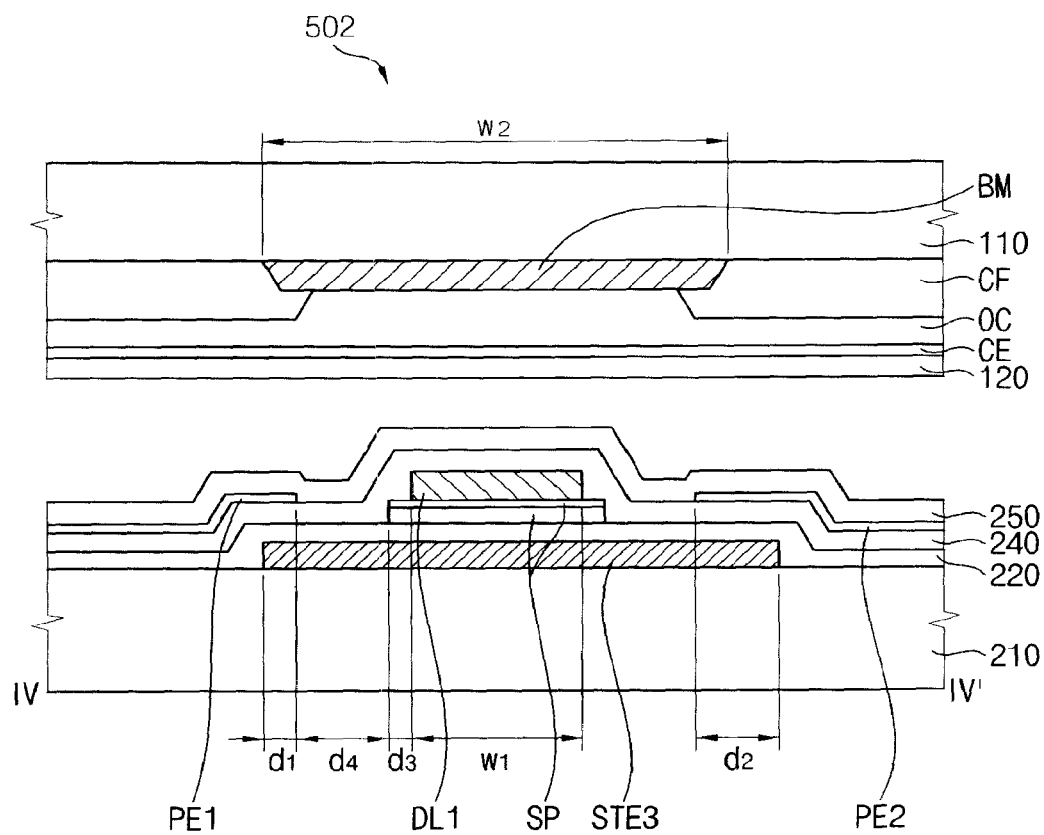
FIG. 8 is a cross-sectional view taken along line IV-IV' of FIG. 7.

FIG. 8 is a cross-sectional view taken along line IV-IV' of FIG. 7.

Referring to FIG. 8, the first data line DL1 has a first width $w_1$. The first width $w_1$ is substantially the same as the first width explained in FIG. 3. Therefore, any further repetitive explanations concerning the same or similar elements will be omitted.

The third storage electrode STE3 is disposed under the first data line DL1, and has a width larger than the first width w1 of the first data line DL1. As illustrated in FIG. 8, sides (e.g., edges) of the third storage electrode STE3 respectively overlap with the first pixel electrode PE1 and the second pixel electrode PE2. The third storage electrode STE3 overlaps with the first pixel electrode PE1 by a predetermined width in the first direction D1. The third side of the third storage electrode STE3 is spaced apart from the edge of the first pixel electrode PE1 by a first distance $d_1$. The first distance $d_1$ is a first overlapping width substantially the same as the first distance $d_1$ explained in FIG. 3. Therefore, any further repetitive explanations concerning the same or similar elements will be omitted.

A fourth side of the third storage electrode STE3 is spaced apart from the edge of the second pixel electrode PE2 by a second distance d2. The second distance d2 defines a second overlapping width between the third storage electrode STE1 and the second pixel electrode PE2. When the third storage electrode STE3 is a base line of symmetry, the first pixel electrode PE1 and the second pixel electrode PE2 asymmetrically overlap with the third storage electrode STE3. The first distance d1 is different from the second distance d2. In one exemplary embodiment, for example, the first overlapping width d2 may be different from a second overlapping width d2, between the first data line DL1 and the second pixel electrode PE2.

A relative distance of the first distance $d_1$ with respect to the second distance $d_2$ depends on a rubbing direction of the second alignment film 250. When the rubbing direction of the second alignment film 250 is from the second data line DL2 to the first data line DL1, the first distance $d_1$ is smaller than the second distance $d_2$. In one exemplary embodiment, for example, when the rubbing direction of the second alignment film 250 is from an area where the first pixel electrode PE1 is disposed, to an area where the second pixel electrode PE2 is disposed, the first overlapping width $d_1$ is smaller than the second overlapping width $d_2$.

In one exemplary embodiment, for example, a difference between the first distance $d_1$ and the second distance $d_2$ is larger than or equal to about 1.0 μm, and smaller than about 3.0 μm. The width of the third storage electrode STE3 may be smaller than the width of the first storage electrode STE1 illustrated in FIG. 1. The first distance $d_1$ may be smaller than the first distance $d_1$ illustrated in FIG. 3, by a distance from about 1.0 μm to about 3.0 μm.

The second alignment film 250 is disposed on the second base substrate 210 including the first, second and third pixel electrodes PE1, PE2 and PE3 disposed on the second base substrate 210. The second alignment film 250 is disposed over an entire of the second base substrate 210. The second alignment film 250 provides pretilt angles to liquid crystal molecules of the liquid crystal layer 300 together with the first alignment film 120 of the first substrate 100.

Figure 9:
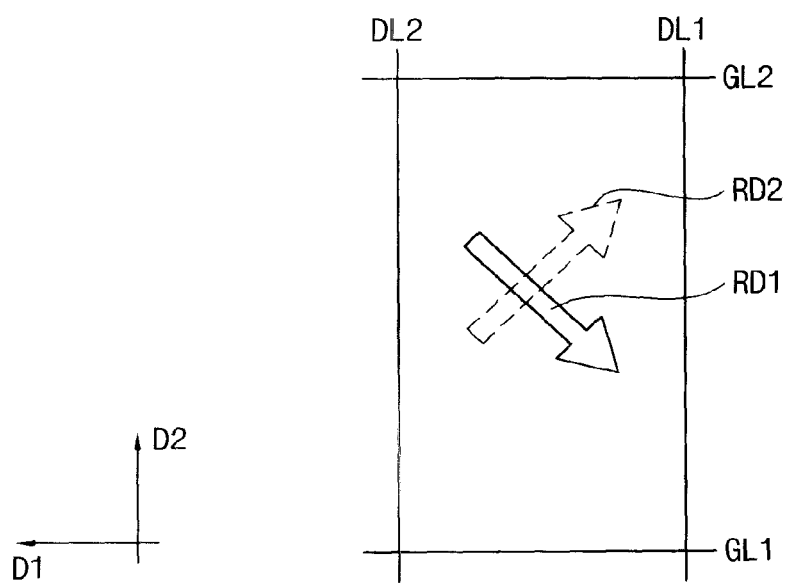
FIG. 9 is a conceptual diagram explaining rubbing directions of first and second alignment films in FIGS. 7 and 8.

FIG. 9 is a conceptual diagram explaining rubbing directions of first and second alignment films in FIGS. 7 and 8.

Referring to FIG. 9, the second alignment film 250 has a first rubbing direction RD1. The first rubbing direction RD1 may be taken from an area where the first pixel electrode PE1 is disposed, to an area where the second pixel electrode PE2 is disposed, in the plan view. The first rubbing direction RD1 may be from an upper side of the second data line DL2 to a lower side of the first data line DL1, in the plan view. When the first gate line GL1 is a base line of symmetry, the first rubbing direction RD1 may be diagonal.

In the rubbing process, when a unit pixel P is a criterion, a rubbing cloth (not shown) moves from a first side of the second data line DL2 defining an outline of the unit pixel P to a second side of the second data line DL2, and passes through the unit pixel P, and then moves from a first side of the first data line DL1 in the unit pixel P to a second side of the first data line DL1 and passes outside of the unit pixel P.

In the rubbing process, the rubbing cloth moves according to a stepped portion between the second data line DL2 and the first pixel electrode PE1, and a stepped portion between the first pixel electrode PE1 and the first data line DL1. In the movement of the rubbing cloth, the rubbing cloth easily moves from a low position to a high position, but hardly moves from the high position to the low position due to the stepped portion. The low and high positions are taken with reference to a distance from the second base substrate 210, for example, the first data line DL1 being in a higher position than that first and second pixel electrodes PE1 and PE2.

When the first distance $d_1$ is substantially the same as the second distance $d_2$, overlapping areas are substantially the same with each other. Therefore, a fluctuation of a coupling capacitance due to the rubbing between the third side of the third storage electrode STE3 and the edge of the first pixel electrode PE1 is larger than that of a coupling capacitance due to the rubbing between the fourth side of the third storage electrode STE3 and the edge of the second pixel electrode PE2.

According to the illustrated exemplary embodiment, the first distance $d_1$ is smaller than the second distance $d_2$, so that the fluctuation of the coupling capacitance due to the rubbing between the third side of the third storage electrode STE3 and the edge of the first pixel electrode PE1 may be minimized. Therefore, the power consumption in the second display panel 502 may decrease.

The first alignment film 120 of the first substrate 100 has a second rubbing direction RD2 different from the first rubbing direction RD1. The second rubbing direction RD2 is substantially the same as a direction from a lower side of the second data line DL2 to an upper side of the first data line DL1, in the plan view.

According to the illustrated exemplary embodiment, the capacitance between the first data line DL1 and the third storage electrode STE3 may decrease, and the aperture ratio of the first display panel 500 may be enhanced.

Figure 10A:
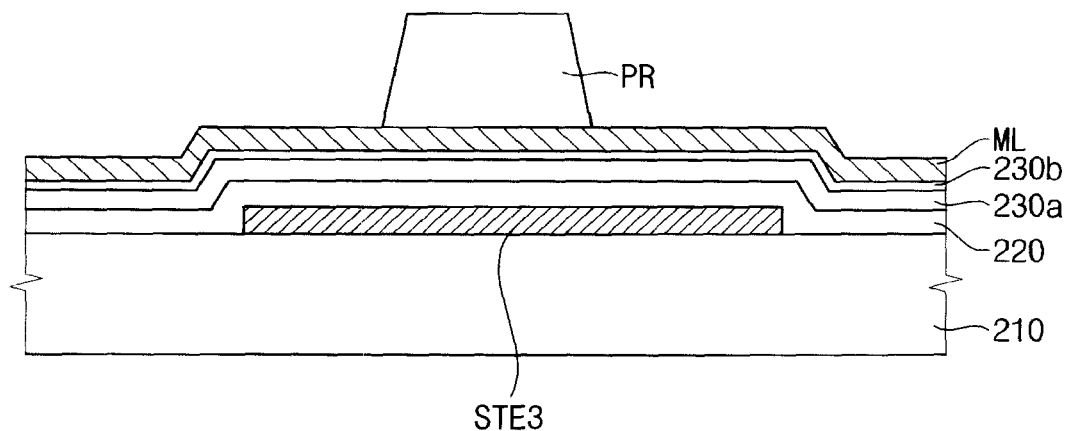
FIGS. 10A to 10C are cross-sectional views explaining an exemplary embodiment of a method of manufacturing a second substrate in FIG. 8.
Figure 10B:
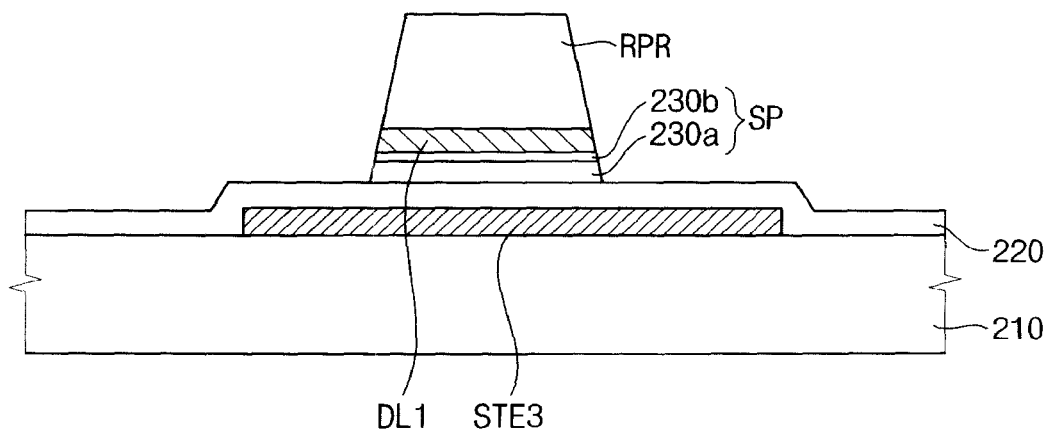
Figure 10C:
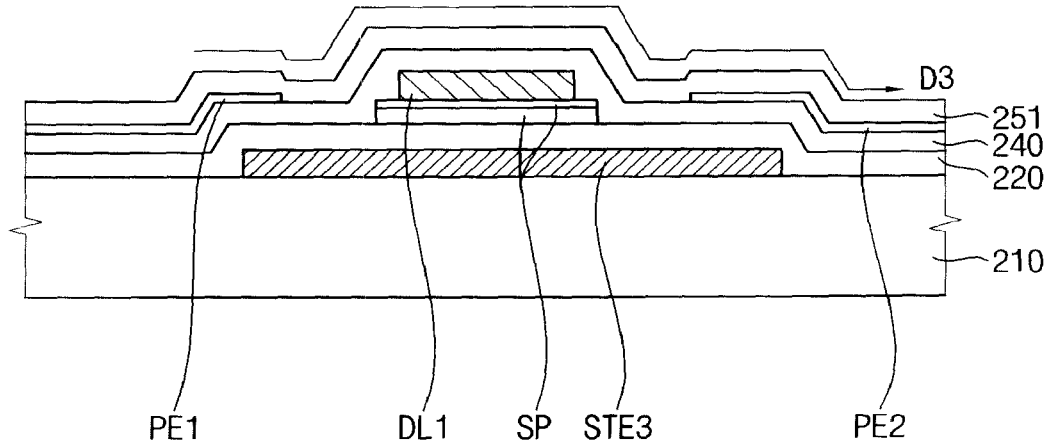

FIGS. 10A to 10C are cross-sectional views explaining an exemplary embodiment of a method of manufacturing the second substrate 200 in FIG. 8.

Referring to FIG. 10A, a third storage electrode STE3 is formed on the second base substrate 210, and a first insulating layer 220, an amorphous silicon layer 230a, an amorphous silicon layer 230b doped with N type dopants of a high concentration, and a metal layer ML are sequentially formed on the second base substrate 210 on which the third storage electrode STE3 is formed. A photoresist pattern PR is formed on the second base substrate 210 on which the metal layer ML is formed.

The amorphous silicon layer 230a, the amorphous silicon layer 230b doped with N type dopants of a high concentration, and the metal layer ML are patterned using the photoresist pattern PR as an etch stopping layer.

Referring to FIG. 10B, the first data line DL1 and the semiconductor pattern SP are formed under the photoresist pattern PR.

The photoresist pattern PR is removed by a predetermined thickness, so that a remaining pattern RPR is formed on the first data line DL1. In forming the remaining pattern RPR, a metal pattern (not shown) connected to the first data line DL1 is partially exposed.

Referring to FIG. 10C, the metal pattern is partially removed using the remaining pattern RPR as an etch stopping layer. Therefore, a source electrode SE and a drain electrode DE of the thin-film transistor SW connected to the first data line DL1 are formed. In partially removing the metal pattern, edges of the first data line DL1 are partially removed. Therefore, the edge of the first data line DL1 is disposed inward more than an edge of the semiconductor pattern SP, and thus the semiconductor pattern SP is protruded more than the first data line DL1, in the plan view.

A second insulating layer 240 is formed on the second base substrate 210 on which the first data line DL1 is formed, and a transparent electrode layer is formed on the second insulating layer 240. The transparent electrode layer is patterned to form the first and second pixel electrodes PE1 and PE2. The first pixel electrode PE1 overlaps with the third side of the third storage electrode STE3, and the second pixel electrode PE2 overlaps with the fourth side of the third storage electrode STE3. When the third storage electrode STE3 is a base line of symmetry, the first pixel electrode PE1 and the second pixel electrode PE2 asymmetrically overlap with the third storage electrode STE3. A distance (e.g., $d_1$) between the third side and the adjacent edge of the first pixel electrode PE1, is smaller than a distance (e.g., $d_2$) between the fourth side and the adjacent edge of the second pixel electrode PE2.

Referring again to FIG. 10C, a base material 251 for an alignment film is coated on the second base substrate 210 including the first and second pixel electrodes PE1 and PE2 formed on the second base substrate 210. The base material 251 for the alignment film coated on the second base substrate 210 is rubbed along a third direction D3. The third direction D3 is substantially the same as the first rubbing direction RD1 illustrated in FIG. 3.

Therefore, a coupling capacitance due to the rubbing between the third side of the third storage electrode STE3 and the adjacent edge of the first pixel electrode PE1 may be minimized. As a result, the power consumption in the second display panel 502 may decrease.

According to the exemplary embodiments of the invention, the aperture ratio may be enhanced, and the capacitance between the storage electrode and the data line may be minimized, so that the power consumption may decrease.

The foregoing is illustrative of the disclosure and is not to be construed as limiting thereof. Although a few exemplary embodiments of the invention have been described, those skilled in the art will readily appreciate that many modifications are possible in the exemplary embodiments without materially departing from the novel teachings and advantages of the disclosure. Accordingly, all such modifications are intended to be included within the scope of the disclosure as defined in the claims.

In the claims, means-plus-function clauses are intended to cover the structures described herein as performing the recited function and not only structural equivalents but also equivalent structures. Therefore, it is to be understood that the foregoing is illustrative of the disclosure and is not to be construed as limited to the specific example embodiments disclosed, and that modifications to the disclosed exemplary embodiments, as well as other exemplary embodiments, are intended to be included within the scope of the appended claims. Embodiments of the invention are defined by the following claims, with equivalents of the claims to be included therein.

What is claimed is:

1. A display panel comprising:
a first substrate; and
a second substrate facing the first substrate and comprising:
a base substrate;
a data line disposed on the base substrate and extending in a first direction;
a gate line disposed on the base substrate and extending in a second direction;
a switching element having a source electrode electrically connected to the data line, and a drain electrode spaced apart from the source electrode;
a first pixel electrode disposed at a first side of the data line, in a plan view of the base substrate; and
a second pixel electrode disposed at a second side of the data line,
wherein the drain electrode includes a first portion extending in a third direction, and a second portion extending in a fourth direction different from the third direction, and at least a portion of the first portion contacts the first pixel electrode.

2. The display panel of claim 1, wherein the third direction is substantially parallel to the data line, and the fourth direction is substantially parallel to the gate line.

3. The display panel of claim 2, wherein drain electrode further includes a connection portion adjacent to the source electrode, and the first portion is disposed between the connection portion and the second portion.

4. The display panel of claim 3, wherein the first portion has a substantially rectangular shape in the plan view.

5. The display panel of claim 4, wherein a width of the first portion in the fourth direction is greater than a width of the second portion in the third direction.

6. The display panel of claim 1, wherein the second substrate further comprises a storage electrode extending in the first direction.

7. The display panel of claim 6, wherein the first substrate includes a black matrix disposed over the storage electrode, and a width of the storage electrode is greater than a width of the black matrix.

8. The display panel of claim 7, wherein a line width of the black matrix ranges from about 6 micrometers to about 15 micrometers.

9. The display panel of claim 6, wherein the storage electrode overlaps the data line.

10. The display panel of claim 6, wherein both sides of the storage electrode respectively overlap with the first pixel electrode and the second pixel electrode.

11. The display panel of claim 6, wherein the first pixel electrode overlaps with the storage electrode by a first overlapping width, and the second pixel electrode overlaps with the storage electrode by a second overlapping width, the second overlapping width being different from the first overlapping width.

12. The display panel of claim 11, further comprising:
an alignment film disposed on the first and second pixel electrodes, and having a rubbing direction taken from an area where the first pixel electrode is disposed, to an area where the second pixel electrode is disposed, in the plan view.

13. The display panel of claim 11, wherein a difference between the first overlapping width and the second overlapping width ranges from about 1.0 micrometer to about 3.0 micrometers.

14. The display panel of claim 6, wherein
the second substrate further comprises a storage line, and a narrow connecting portion which extends from the storage line and connects the storage electrode to the storage line, and
a width of the narrow connecting portion is smaller than the width of the storage electrode.

15. The display panel of claim 14, wherein the width of the narrow connecting portion is smaller than a width of the data line.

16. The display panel of claim 14, wherein the storage line extends in the second direction and the narrow connection portion extends from the storage line in the first direction.

17. The display panel of claim 6, further comprising:
a semiconductor pattern disposed between the data line and the storage electrode.

18. The display panel of claim 17, wherein a width of the semiconductor pattern is greater than a width of the data line.

19. The display panel of claim 17, wherein a distance between the semiconductor pattern and any one of the first and second pixel electrodes is smaller than a width of the data line.

* * * * *